United States Patent [19]
Yamada

[11] Patent Number: 5,198,668
[45] Date of Patent: Mar. 30, 1993

[54] AUTOMATIC FOCUSING APPARATUS FOR SCANNING ELECTRON MICROSCOPE

[75] Inventor: Atsushi Yamada, Tokyo, Japan

[73] Assignee: JEOL Ltd., Tokyo, Japan

[21] Appl. No.: 813,907

[22] Filed: Dec. 23, 1991

[51] Int. Cl.[5] .............................................. H01J 37/26
[52] U.S. Cl. .................................... 250/310; 250/307; 250/397
[58] Field of Search ............... 250/307, 310, 311, 397; 315/382

[56] References Cited

U.S. PATENT DOCUMENTS

| | | | |
|---|---|---|---|
| 3,937,959 | 2/1976 | Namae | 250/310 |
| 4,199,681 | 4/1980 | Namae | 250/311 |
| 4,514,634 | 4/1985 | Lawson | 250/397 |
| 4,605,860 | 8/1986 | Fukuhara et al. | 250/397 |
| 4,978,856 | 12/1990 | Akado | 250/310 |
| 5,032,725 | 7/1991 | Kanda | 250/310 |
| 5,130,540 | 7/1992 | Yamada et al. | 250/310 |

OTHER PUBLICATIONS

Kazuo Kasahara, Kenki Hashimoto, Haruo Doi and Tokuzou Tsujimoto (National Research Institute for Metals, Tokyo), "Oxidation Behavior of Intermetallic Compounds . . . ", J. of the Japan Inst. Metals, vol. 53, No. 1 (1989), pp. 58-62.

Keita Kawamura, Akira Hirasawa, Shinji Aoki, Hitoshi Kimura et al., (Ebara Corporation), "Treatment of Exhaust Gases by Electron Beam Irradiation", J. of Atomic Energy Society of Japan, vol. 20, No. 5 (1978), pp. 359-367.

*Primary Examiner*—Jake I. Berman
*Assistant Examiner*—Jim Beyer
*Attorney, Agent, or Firm*—Webb, Burden, Ziesenheim & Webb

[57] ABSTRACT

An automatic focusing apparatus incorporated in a scanning electron microscope. The focusing apparatus permits accurate focusing even if a very uneven specimen surface is observed. The apparatus has a secondary electron detector. The output signal from this detector is supplied to a peak-holding circuit via a low-pass filter. The greatest peak value of the signal is detected and stored in a memory whenever the electron beam makes a scan at each different focal length of the objective lens. This processing is performed concurrently with integration of the output signal from the detector. This set of operations is repeated for all focal lengths. Data in the memory are compared with each other by a comparator, and the greatest peak value is found. Data about the focal length providing the greatest peak value is supplied as a reference signal to another comparator. In response to this data, data about several focal lengths close to this focal length are read from the memory and compared with each other. The focal length which makes the output value from the integrator maximal is selected from these focal lengths. The exicting current fed to the objective lens is determined according to data about this focal length.

2 Claims, 5 Drawing Sheets

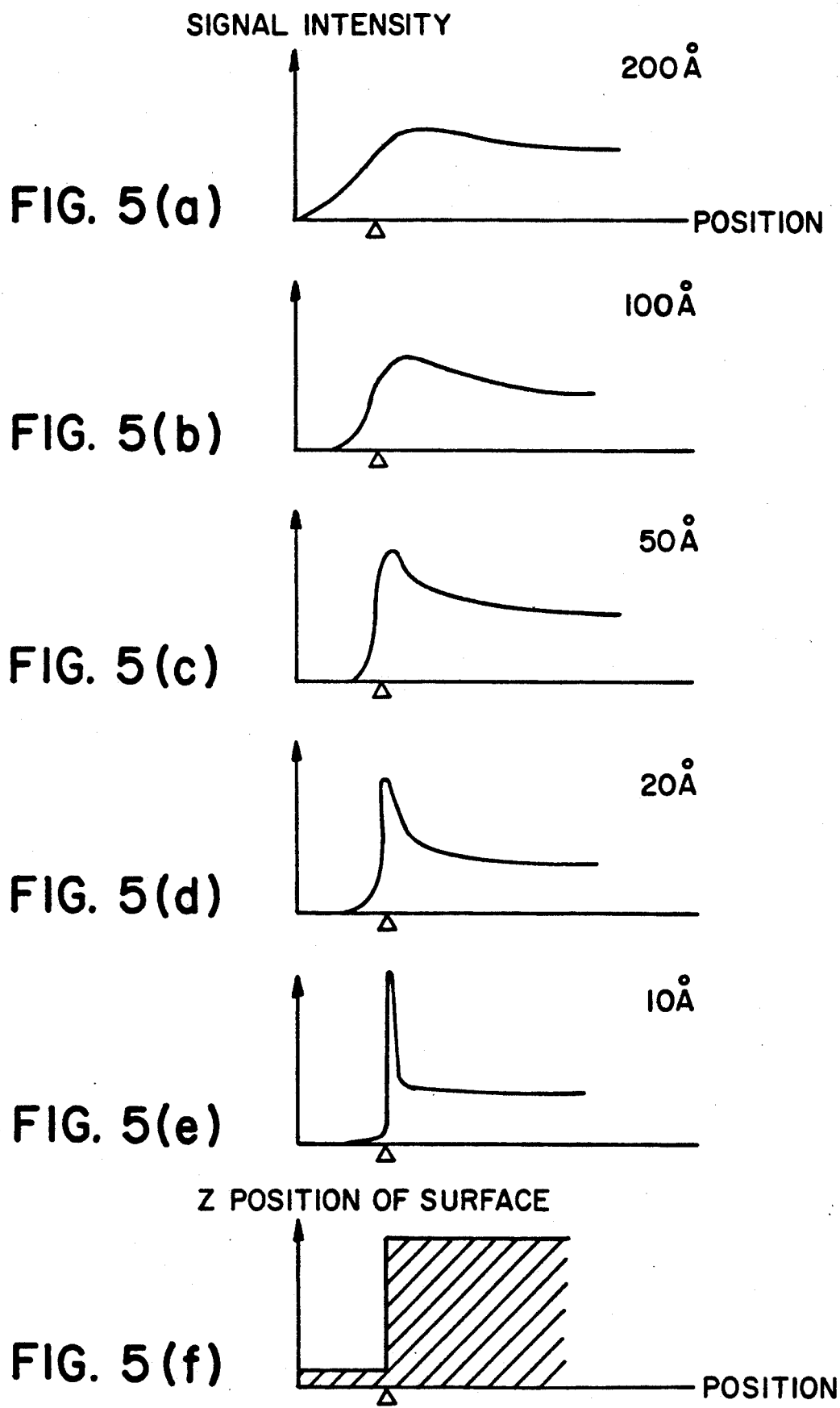

AUTOMATIC FOCUSING APPARATUS FOR SCANNING ELECTRON MICROSCOPE

FIELD OF THE INVENTION

The present invention relates to an automatic microscope.

BACKGROUND OF THE INVENTION

Various apparatus have been developed to automate focusing of scanning electron microscopes. One example of such apparatus is disclosed in U.S. Pat. No. 4,199,681. Also, an apparatus of the construction shown in FIG. 3 is known.

Referring to FIG. 3, an electron beam 1 is focused onto a specimen 3 by an objective lens 2. A deflector 5 is driven in response to scanning signals produced by a scan generator 4. The electron beam on the specimen 3 is scanned in two dimensions by the deflector 5. As a result, secondary electrons are emitted from the specimen. These secondary electrons are detected by a secondary electron detector 6. The output signals from the detector 6 are converted into digital form by an analog-to-digital converter 7 and stored in a video memory incorporated in a display unit 8 in synchronism with the scan. An appropriate SEM image is displayed on the viewing screen of the display unit according to the stored data. The output signal from the detector 6 is supplied to the display unit 8 and also to an integrator 12 via a high-pass filter 10, and an absolute value circuit 11. The cutoff frequency of the high-pass filter 10 is selected to cut off noises from commercial frequencies. During one focusing step, i.e., at a given focal length, the objective lens 2 is excited according to a given current value set into an objective lens control circuit 13. The integrator 12 integrates the output signal from the absolute value circuit 11 whenever a scan is made at each different focal length. The output signal from the integrator 12 is stored via an analog-to-digital converter 14 in a memory 16 that exists within a central processing unit (CPU) 15. The integration period of integrator 12 is controllable. The signal is integrated during one set of scan lines (for example, during a single frame). The integrator is reset for the next set of scan lines at a new focal length. This processing for finding the integrated value is repeated with different values of exciting current supplied to the objective lens 2 for all the focusing steps, i.e., for every focal length. The results are successively stored in the memory 16. The values stored in the memory 16 are compared with each other by a comparator circuit 17. Data about the focal length which produced the greatest one of the compared values is supplied to the lens control circuit 13. Then, this control circuit 13 determines the exciting current that should be supplied to the objective lens from the data about the focal length. This exciting current is supplied to the objective lens 2 from a lens power supply 18, thus completing this focusing operation.

FIG. 4(a) shows the output signal from the integrator of the above-described automatic focusing apparatus. Where the unevenness of the surface of the specimen irradiated with the electron beam is relatively small, the integrator produces a signal as shown in this figure. On the other hand, where the specimen surface is very rough in the vertical direction and has sharp edges, the amount of secondary electrons emitted from the specimen surface increases in the following two cases. One case is where the focal point is approached. In other words, the electron beam spot size on the surface approaches the minimum value. The other case is where the electron beam spot size on the specimen surface is fairly large and the electron beam is not focused on the specimen surface. Therefore, as shown in FIG. 4(b), a plurality of peaks appear in the output signal from the integrator. This phenomenon is described in more detail below.

FIGS. 5(a) to 5(e) show the intensities of signals obtained when a specimen of a cross section having a shape as shown in FIG. 5(f) is scanned with the electron beam. FIGS. 5(a) to 5(e) show the intensities of signals arrived where the electron beam diameter ranges from 200 Å to 10 Å. As can be seen from these graphs, the amount of secondary electrons produced in response to the scans which are made with the electron beam of a diameter of 10 Å, i.e., under focused condition, is very large at the edge, but the amount is quite small in other locations. On the other hand, in defocused condition, the amount of secondary electrons emanating from the surface portions surrounding the edge is larger than the amount produced in focused condition. This is explained away as follows. In defocused condition, the electron beam spot on the specimen surface has a large diameter and $f_o$ a part of the beam hits the edge if the irradiated position is somewhat remote from the edge. Therefore, in some cases, the value obtained by integrating the output signal from the detector in defocused condition is larger than the value obtained in the above-described focused condition. Consequently, where the above-described automatic focusing apparatus is employed to observe very uneven specimen surfaces, it is impossible to carry out an accurate focusing operation.

SUMMARY OF THE INVENTION

It is an object of the present invention to provide an automatic focusing apparatus which is incorporated in a scanning electron microscope and capable of performing an accurate focusing operation even if a very uneven specimen surface is observed.

The above object is achieved in accordance with the teachings of the invention by an apparatus for use in a scanning electron microscope having an electron gun emitting an electron beam and an objective lens for focusing the beam onto a specimen, said apparatus comprising: a means for varying the exciting current supplied to the objective lens in increments at regular intervals of time; a means for causing the electron beam to scan the specimen at each of different values of the focal length of the objective lens determined by the various exciting current values; an integrator means for integrating the signal obtained from the specimen when a scan is made at each different focal length; a means for storing each output value from the integrator means; a low-pass filter to which said signal is supplied; a means for detecting the focal length at which the output signal from the low-pass filter assumes the greatest value; a means for comparing output values from the integrator means obtained at plural focal lengths close to the detected focal length and selecting the focal length which gives rise to the greatest one of the compared values; and a means for setting the exciting current supplied to the objective lens according to the selected focal length.

Other objects and features of the invention will appear in the course of the description thereof which follows.

BRIEF DESCRIPTION OF THE DRAWINGS

FIGS. 5(a) to 5(e) are graphs showing the relation of the amount of secondary electrons released by the edge effect to the diameter of the electron beam, or the degree of defocus;

FIG. 5(f) is a cross section of a specimen;

DETAILED DESCRIPTION OF THE INVENTION

Figure 1:
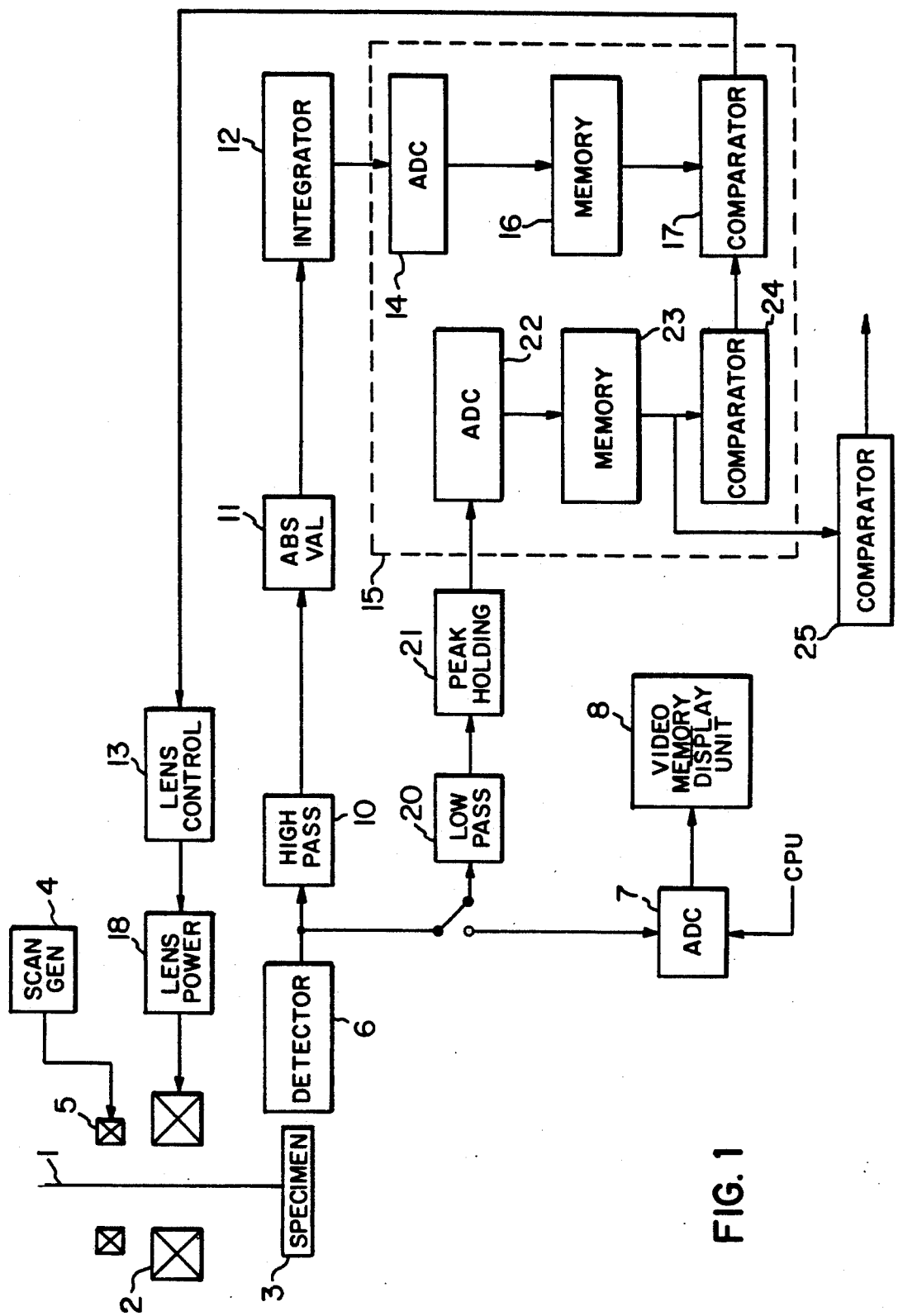
FIG. 1 is a block diagram of a scanning electron microscope incorporating an automatic focusing apparatus according to the invention.
Figure 3:
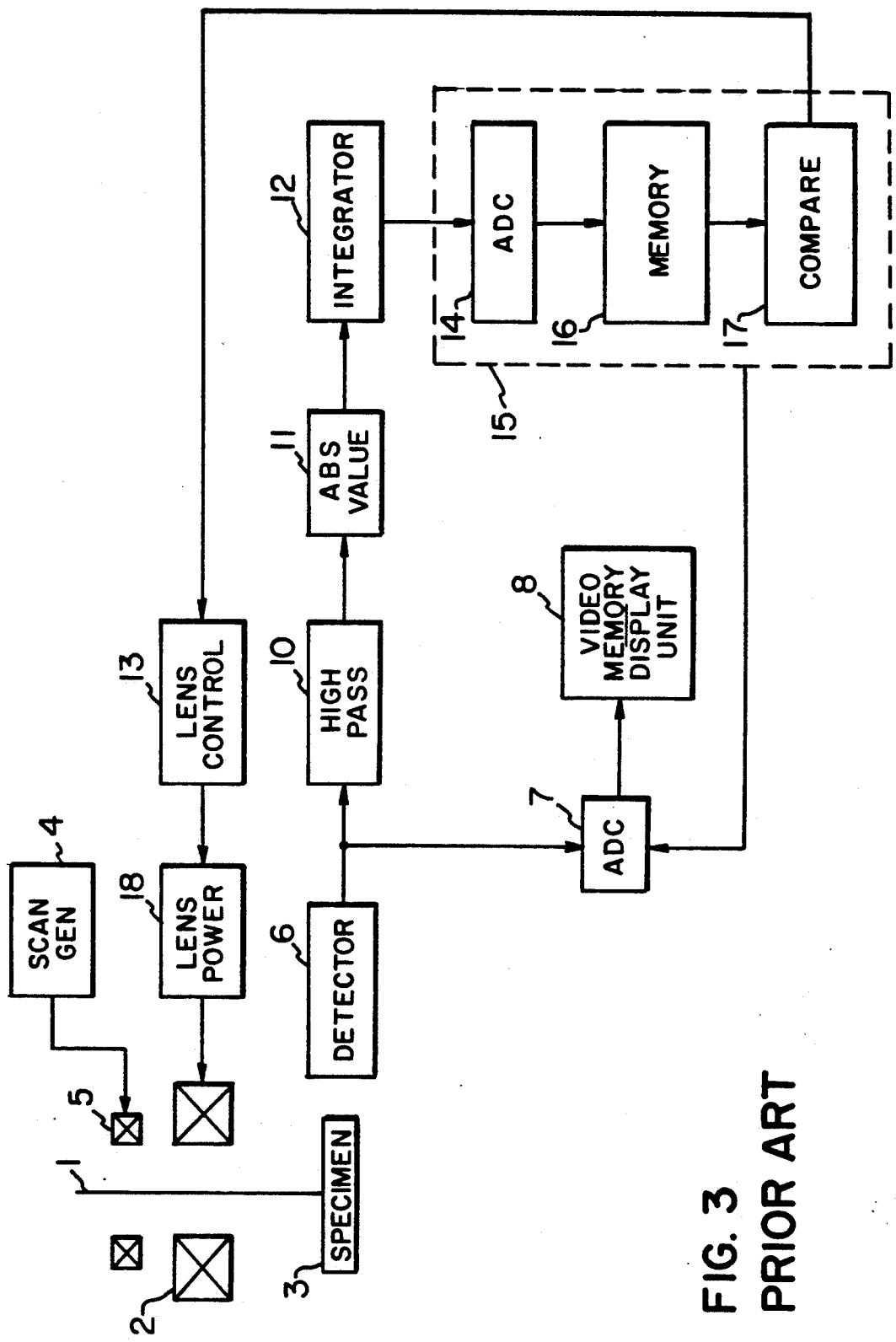
FIG. 3 is a block diagram of a scanning electron microscope incorporating the prior art automatic focusing apparatus.

Referring to FIG. 1, there is shown a scanning electron microscope incorporating an automatic focusing apparatus according to the invention. It is to be noted that like components are indicated by like reference numerals in various figures and that those components which have already been described in connection with FIG. 3 will not be described below.

The output signal from the secondary electron detector 6 is supplied to a peak-holding circuit 21 via a low-pass filter 20. The cutoff frequency for low-pass filter 20 is selected to cut off the photomultiplier shot noises. At each different value of the focal length of the objective lens 2, it is excited according to a given current value set into the control circuit 13, and the peak-holding circuit 21 detects the greatest one of the peak values of the output signal from the filter 20 during a portion of one scan line, an entire scan line, multiple scan lines, a field or a frame. The greatest peak value is placed into a memory 23 included in the CPU 15 via an A/D converter 22. This processing is performed concurrently with the operation of the integrator 12. This set of operations is repeated with different values of the exciting current fed to the objective lens 2 for all values of the focal lengths of the objective lens 2. The results are successively stored in the memory 23. Then, the held peaks stored in the memory 23 are compared with each other by a comparator circuit 24. Data about the focal length giving this greatest peak value is supplied as a reference signal to the comparator circuit 17. Let f' be this focal length. The comparator circuit 17 reads data about several focal lengths existing within a range demarcated by $f' \pm \Delta f$ (FIG. 2) from the memory 16, where $\Delta f$ is a small distance. The size of $\Delta f$ may be varied to obtain good results. If it is too large, the system cannot select the focal length $f_o$ which produces the greatest integrated value nearest the greatest peak value f'. The comparator circuit 17 compares the data, detects the focal length $f_o$ at which the output value from the integrator assumes its greatest value among the data about several focal lengths. Then, the comparator circuit 17 supplies the data about this focal length $f_o$ to the lens control circuit 13. The lens control circuit 13 determines the value of the exciting current according to the data about this focal length $f_o$. This exciting current is fed to the objective lens 2 from the lens power supply 18, thus completing the focusing operation.

Figure 2:
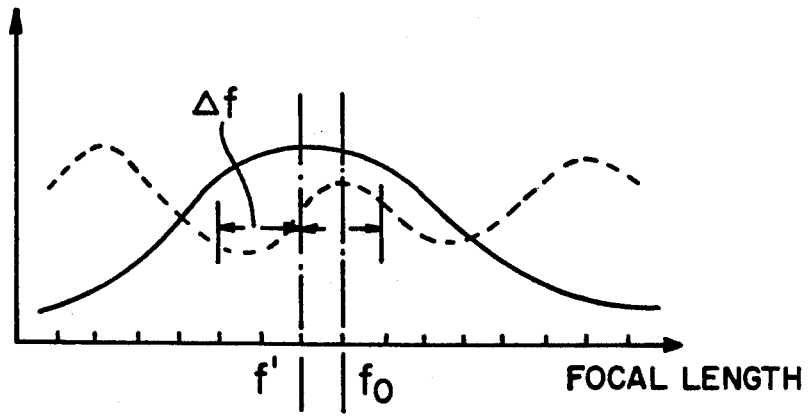
FIG. 2 is a graph showing the peak values held by the automatic focusing apparatus shown in FIG. 1, as well as the output values from an integrator included in the apparatus.
Figure 4A:
FIG. 4(a) is a graph showing integrated values obtained from a flat specimen surface by the prior art automatic focusing apparatus shown in FIG. 3.
Figure 4B:
FIG. 4(b) is a graph showing integrated values obtained from a very uneven specimen surface by the prior art automatic focusing apparatus shown in FIG. 3.

FIG. 2 shows the peak values held by the above-described peak-holding circuit 21, as well as output values obtained simultaneously from the integrator. In this figure, the solid line indicates the held peak values. The broken line indicates the output values from the integrator.

In the instrument described above, the low-pass filter 20 is located before the peak-holding circuit 21 to filter out noise components and, therefore, the greatest value of the signals shown in FIGS. 5(a) to 5(e) can be detected. However, the output signal from the peak-holding circuit 21 which holds the peak value of the output signal from the low-pass filter 20 takes a blunt shape around the peak as shown in FIG. 2. For this reason, accurate focusing cannot be achieved only if the peak point shown in FIG. 2 is detected. Accordingly with the present invention, a region containing the peak of the output signal from the peak-holding circuit 21 is selected. Within this region, the values obtained by the integration are compared with each other. The focal length providing the greatest one of these compared values is found. This focal length $f_o$ is regarded as providing the correct focal plane.

Referring again to FIG. 1, there is provided a comparator circuit 25 to detect the minimal and maximal values of the values contained in the data about the held peaks. The maximal and minimal peak values found by the comparator circuit 25 are supplied to the CPU, where they are used as reference signals for the display unit, for a device for automatically adjusting the brightness and/or the contrast of the detector, and for the automatic gain control device, it being noted that none of either the unit or devices are shown. To automatically adjust the gray levels, the average position of the values obtained by integration under focused condition is taken as the middle step of a gray scale. In order to automatically adjust the contrast, the difference between the maximum peak value and the minimum peak value found by the comparator circuit 25 is calculated, and then the difference is divided by a reference contrast voltage. These arithmetic operations are performed by the CPU. In this manner, automatic adjustment of the brightness and/or contrast and adjustment of the gain can be made simultaneously with automatic focusing.

While a preferred embodiment of the invention has been described, such description is for illustrative purposes only, and it is to be understood that changes and variations may be made without departing from the spirit or scope of the appended claims. For example, in the above embodiment, the focal length at which the output signal from the low-pass filter assumes its maximum value is detected. Values obtained by integration at focal lengths close to the former focal length are compared with each other. Then, the focal length producing the greatest value is found. A scheme illustrated in FIGS. 6 and 7 can also be adopted.

Figure 6:
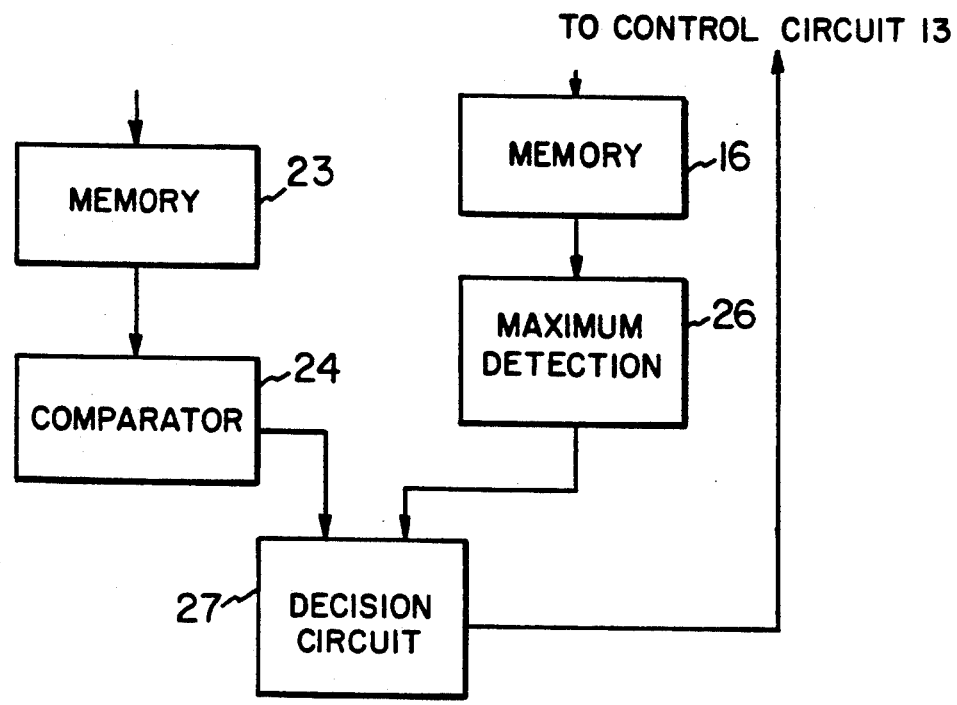
FIG. 6 is a block diagram of main portions of another automatic focusing apparatus according to the invention.

FIG. 6 shows main portions of a scanning electron microscope which is similar to the microscope shown in FIG. 1 except for the following points. A maximum-detecting circuit 26 is provided to detect the focal length at which the integrator output value stored in the memory 16 assumes its maximum value. The output signal from the maximum-detecting circuit 26 and the output signal from the comparator circuit 24 are sent to a focusing decision circuit 27.

In the operation of this instrument, the maximum-detecting circuit 26 reads the integrator output values stored in the memory 16, detects the focal lengths producing the relative maximal integrator output values, and stores these focal lengths.

Figure 7:
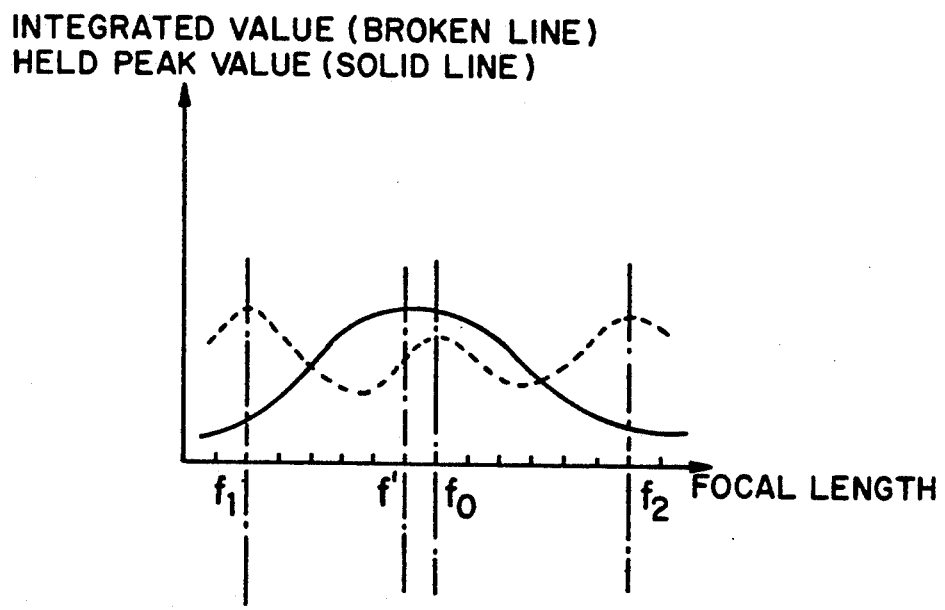
FIG. 7 is a graph illustrating the operation of the automatic focusing apparatus shown in FIG. 6.

Referring to FIG. 7, it is assumed that relative maximal values are found to appear at three focal lengths $f_1$, $f_o$, and $f_2$. The maximum-detecting circuit 26 stores these focal lengths. Meanwhile, the comparator circuit 24 reads the held peak values from the memory 23 and detects the focal length giving the held peak signal that is maximal. We then assume that the comparator circuit 24 detects a focal length f' shown in FIG. 7 as that focal length. The output signal from the comparator circuit 24 which indicate the focal length f' and the output signals from the maximum-detecting circuit 26 which indicate the focal lengths $f_1$, $f_o$, and $f_2$ are all sent to the focusing decision circuit 27. The decision circuit 27 selects the focal length closest to f' from the focal lengths $f_1$, $f_o$, and $f_2$ and regards this focal length as giving the correct focal plane. The exciting current fed to the objective lens 2 is set according to the exciting current corresponding to this focal length.

As can be understood from the description made thus far, in accordance with the present invention, accurate focusing is possible even if very uneven specimen surfaces are observed.

Having thus described my invention with the detail and particularity required by the Patent Laws, what desired to be protected by Letters Patent is set forth in the following claims.

What is claimed is:

1. An automatic focusing apparatus for use in a scanning electron microscope having an electron gun emitting an electron beam and an objective lens for focusing the electron beam onto a specimen, said automatic focusing apparatus comprising:
   a means for varying the exciting current supplied to the objective lens in increments at regular intervals of time;
   a means for causing the electron beam to scan the specimen at each of different focal lengths determined by the various exciting current values;
   a means for detecting a specimen signal from the specimen when it is scanned;
   an integrator means for integrating the specimen signal obtained from the specimen whenever a scan is made at each different focal length to produce an integrated scan value;
   a means for storing each integrated scan value from the integrator means;
   a low-pass filter to which said specimen signal is supplied;
   a means for detecting the focal length f' at which the output signal from the low-pass filter assumes its maximum value among all scans at different focal lengths;
   a means for comparing the integrated scan values from the integrator means obtained at plural focal lengths sufficiently close to the focal length f' to include a nearby peak of the integrated scan values and selecting the focal length $f_o$ having the greatest integrated scan value; and
   a means for setting the exciting current supplied to the objective lens according to the exciting current corresponding to the selected focal length $f_o$.

2. An automatic focusing apparatus for use in a scanning electron microscope having an electron gun emitting an electron beam and an objective lens for focusing an electron beam onto a specimen, said automatic focusing apparatus comprising:
   a means for varying the exciting current supplied to the objective lens in increments at regular intervals of time;
   a means for causing the electron beam to scan the specimen at each of different focal lengths determined by the various exciting current values;
   a means for detecting a signal from the specimen when it is scanned;
   an integrator means for integrating the signal obtained from the specimen whenever a scan is made at each different focal length;
   a means for storing each output value from the integrator means;
   a means for detecting plural focal lengths at which the output values from the integrator means are relative maximal;
   a low-pass filter to which said signal is supplied;
   a means for detecting the focal length f' at which the output signal from the low-pass filter assumes its greatest value;
   a means for selecting the focal length $f_o$ which is closest to the focal length f' from the plural focal lengths; and
   a means for setting the exciting current supplied to the objective lens according to the exciting current corresponding to the selected focal length.

* * * * *

UNITED STATES PATENT AND TRADEMARK OFFICE
CERTIFICATE OF CORRECTION

PATENT NO. : 5,198,668
DATED : March 30, 1993
INVENTOR(S) : Atsushi Yamada It is certified that error appears in the above-identified patent and that said Letters Patent is hereby corrected as shown below:

Cover page, after [22] filing date information, insert item [30]:
 --Foreign Application Priority Data
  Dec. 27, 1990 [JP] Japan ... 2-414868--.

Column 1 Line 6 after "automatic" insert --focusing apparatus incorporated in a scanning electron--.

Column 2 Line 26 "$f_o$" should read --so--.

Column 5 Line 37 after "what" insert --is claimed and--.

Signed and Sealed this

Fourteenth Day of February, 1995

*Attest:*

BRUCE LEHMAN

*Attesting Officer*     *Commissioner of Patents and Trademarks*